United States Patent
Nam et al.

(10) Patent No.: US 7,573,772 B2
(45) Date of Patent: Aug. 11, 2009

(54) SEMICONDUCTOR MEMORY DEVICE AND SELF-REFRESH METHOD THEREFOR

(75) Inventors: Kyung-Woo Nam, Seoul (KR); Ho-Cheol Lee, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 2 days.

(21) Appl. No.: 11/612,866

(22) Filed: Dec. 19, 2006

(65) Prior Publication Data

US 2007/0297258 A1  Dec. 27, 2007

(30) Foreign Application Priority Data

Jun. 20, 2006  (KR)  ....................... 10-2006-0055206

(51) Int. Cl.
*G11C 7/00* (2006.01)
(52) U.S. Cl. .................. 365/222; 365/196; 365/189.04; 365/189.14; 365/233.19
(58) Field of Classification Search ................ 365/222, 365/196, 189.04, 189.14, 233.19
See application file for complete search history.

(56) References Cited

U.S. PATENT DOCUMENTS

| | | | | |
|---|---|---|---|---|
| 5,835,965 A | * | 11/1998 | Taylor et al. ................. | 711/211 |
| 5,949,733 A | * | 9/1999 | Kotani et al. ........... | 365/230.03 |
| 6,178,517 B1 | * | 1/2001 | Bertin et al. ........... | 365/230.02 |
| 7,120,761 B2 | * | 10/2006 | Matsuzaki et al. ...... | 365/189.02 |
| 2002/0078311 A1 | * | 6/2002 | Matsuzaki et al. .......... | 711/149 |
| 2003/0063515 A1 | | 4/2003 | Jain | |
| 2003/0135699 A1 | * | 7/2003 | Matsuzaki et al. .......... | 711/149 |
| 2004/0090830 A1 | * | 5/2004 | Lee et al. ..................... | 365/200 |
| 2005/0276141 A1 | * | 12/2005 | Pelley et al. ................. | 365/221 |
| 2005/0289293 A1 | | 12/2005 | Parris et al. | |

* cited by examiner

*Primary Examiner*—Thong Q Le
(74) *Attorney, Agent, or Firm*—F. Chau & Assoc., LLC (57) ABSTRACT

A semiconductor memory device and a self-refresh method in which the semiconductor memory device includes a plurality of input/output ports having respective independent operation, a period of self-refresh through one of the plurality of input/output ports being subordinate to a kind of operation through another input/output port. Whereby, a refresh characteristic in a multi-port semiconductor memory device including a dual-port semiconductor memory device may be improved.

10 Claims, 7 Drawing Sheets

SEMICONDUCTOR MEMORY DEVICE AND SELF-REFRESH METHOD THEREFOR

BACKGROUND OF THE INVENTION

1. Technical Field

The present disclosure relates to semiconductor memory devices and, more particularly, to a semiconductor memory device and a self-refresh method therefor, which is capable of controlling a self-refresh period performed through one input/output port according to the kind of operations performed through another input/output port in a multi-port semiconductor memory device.

2. Discussion of Related Art

In general, one memory cell of a DRAM (Dynamic Random Access Memory) includes one select transistor and one data storage capacitor. A DRAM is well known as a semiconductor memory device suitable for a high integration density on a semiconductor substrate. The DRAMs need to be periodically refreshed with a recharge operation performed on the DRAM cells, since charge leaks through the storage capacitor and the select transistor. That is, semiconductor memory devices such as DRAMs require a configuration of refresh control circuits and the like to control operations relating to a refresh operation.

Several methods widely used to refresh memory cells of a semiconductor memory device such as the DRAMs will be described as follows.

First, in a row address strobe (RAS) only refresh (ROR) method, only a row address strobe (RAS) signal is enabled while a column address strobe (CAS) signal is maintained at a precharge level, thereby performing the refresh operation of the cells. In the ROR method, refresh addresses should be provided from the outside to the memory device to perform the respective refresh operations, and during the respective refresh operations, address buses coupled to the memory device are not used for any other purposes.

Another refresh method, the automatic refresh method, may also be used. In the automatic refresh method, a CBR (CAS Before RAS) refresh method may be employed. Generally, when memory cells are accessed in a normal operation mode, RAS signals applied externally are enabled prior to the CAS signals being applied externally. In the automatic refresh method, however, a CAS signal is activated prior to an RAS signal, so as to recognize the refresh mode. In other words, the CAS signal becomes a low level before the RAS signal becomes a low level, thereby performing the refresh operation. In this method, refresh addresses are generated internally from a built-in refresh address counter, and an external control for the refresh address counter is not employed.

Furthermore, most of the currently used DRAMs employ a self-refresh mode to lessen the amount of current consumed in the refresh operation. A start cycle of this mode is the same as that of the automatic refresh method. In other words, when CAS and RAS signals simultaneously keep an active state, for example, a low level, during a given length of time, for example, over 100 μs; a self-refresh operation is performed. That is, data stored in all of the memory cells is read out by using a refresh timer during a given refresh period, then the data are amplified and re-stored back in the memory cells. During such a refresh operation, the general operations, such as the read and write operations are interrupted. In the self-refresh method, the refresh timer and the refresh address counter built into the DRAM automatically perform the required-refresh operation by using their own clock signals, without the assistance of any clock signals provided from the outside. This type refresh technology is disclosed in U.S. Pat. Nos. 4,809,233, 4,939,695, 4,943,960 and 5,315,557.

Figure 1:
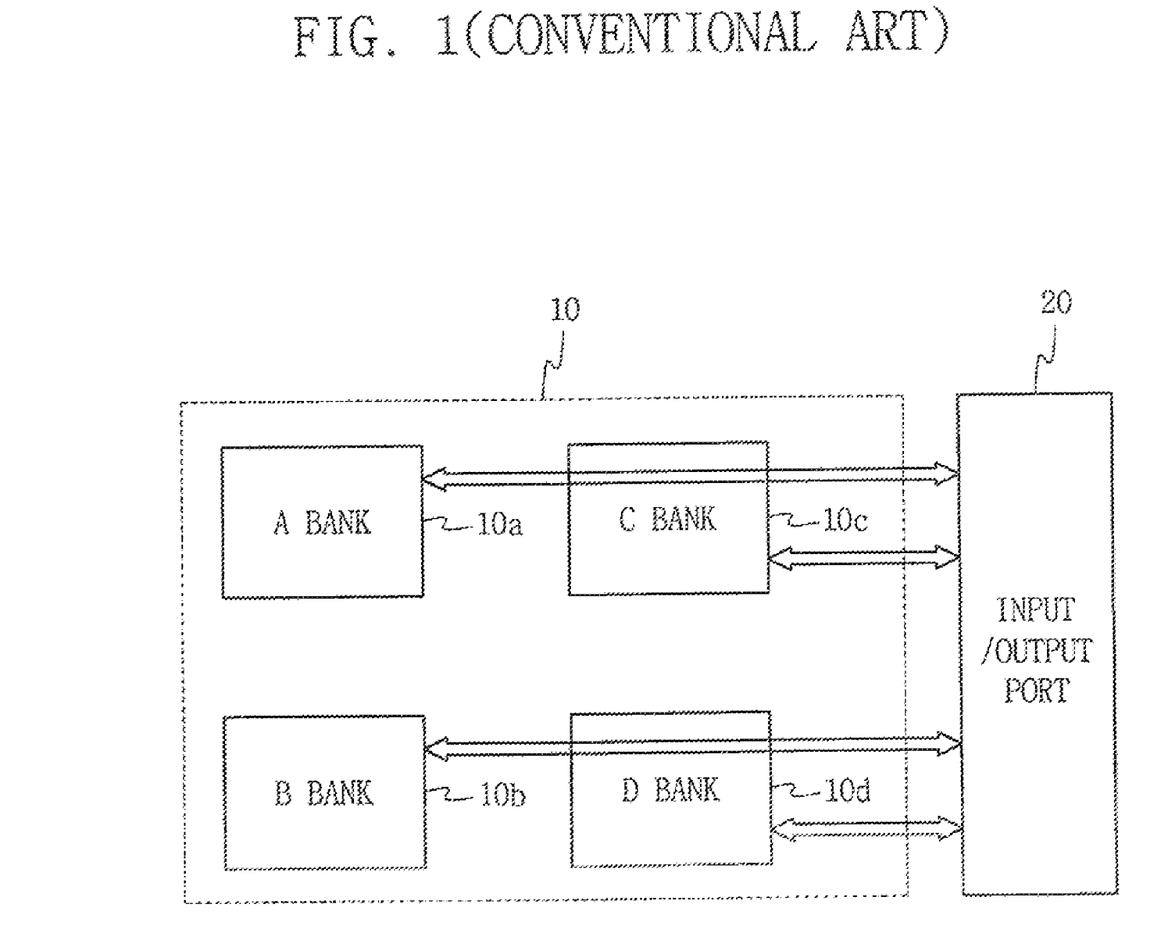
FIG. 1 illustrates access paths of a conventional single port semiconductor memory device.

A semiconductor memory device performing such refresh operations may be classified into classes of a single port semiconductor memory device and a multi-port semiconductor memory device. FIG. 1 illustrates the single port semiconductor memory device.

FIG. 1 illustrates access paths of a conventional semiconductor memory device having four memory banks and a single input/output port.

Referring to FIG. 1, a conventional semiconductor memory device shown therein includes a memory array 10 having four memory banks 10a, 10b, 10c and 10d and a single input/output port 20. The input/output port 20 provides an input/output path for a command signal, an address signal, a data signal and other signals (not shown) provided between the semiconductor memory device and an external processor (not shown).

All of the memory banks 10a, 10b, 10c and 10d constituting the memory array 10 are configured to be accessed through the same input/output port 20, and the arrows shown as FIG. 1 indicate these access paths.

Thus, this conventional single port memory device is configured to access all memory banks constituting the memory array through one port. A refresh operation based on this configuration is performed by inputting command signals through one port. This conventional configuration, however, may be inadequate for high speed or high efficiency operation. A multi-port semiconductor memory device to overcome such a problem has been developed. This multi-port semiconductor memory device has the advantages of communicating through a plurality of processors and simultaneously accessing a plurality of memory cells through a plurality of input/output ports. Such a multi-port semiconductor memory device, however, has defects in its refresh operation.

Figure 2:
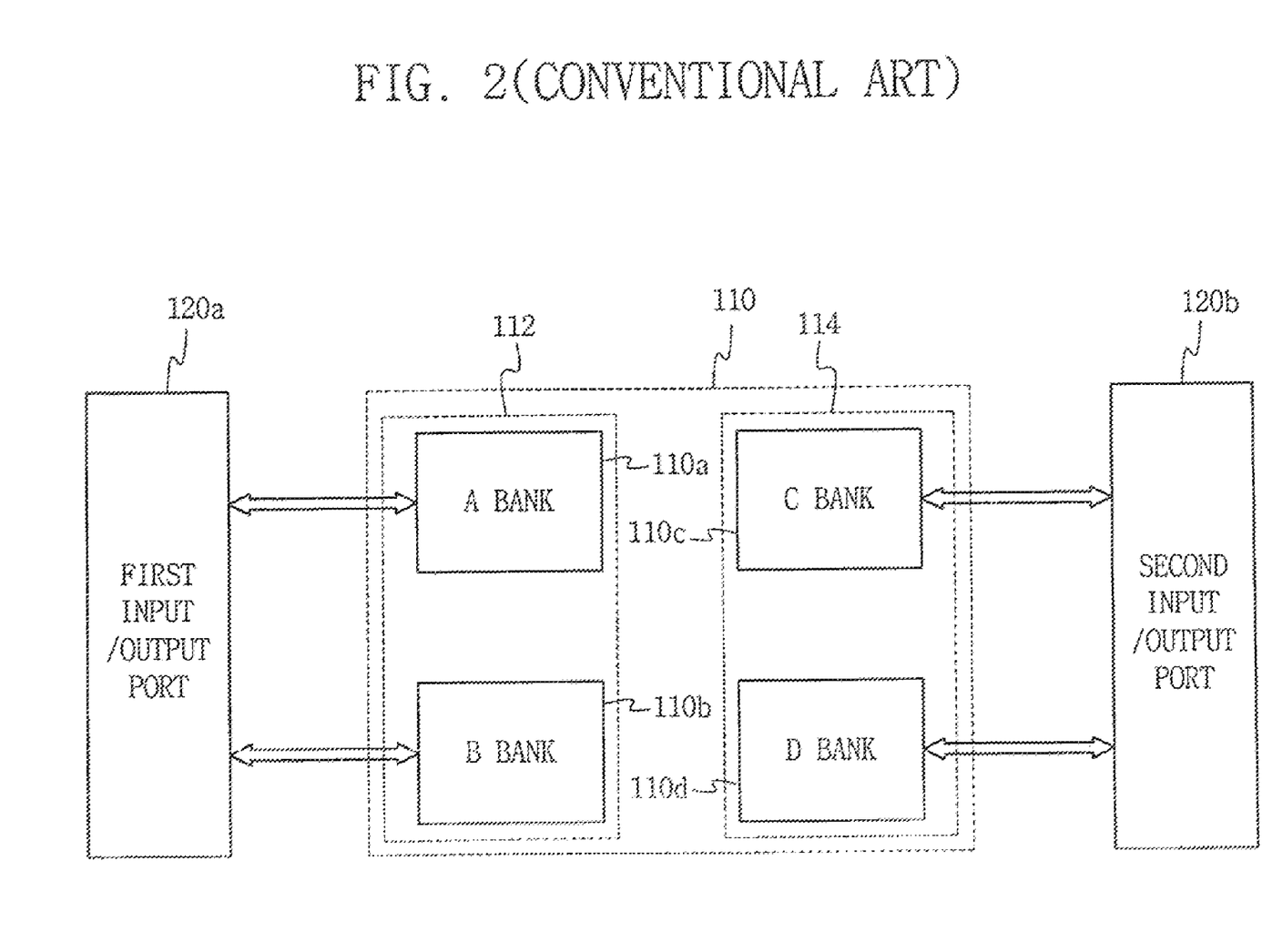
FIG. 2 illustrates access pathos of a conventional dual-port semiconductor memory device.

FIG. 2 illustrates access paths of a dual-port semiconductor memory device in a conventional multi-port semiconductor memory device. As shown in FIG. 2, a conventional dual-port semiconductor memory device includes a memory array 110, a first input/output port 120a and a second input/output port 120b.

Memory array 110 is divided into a plurality of different memory regions. The memory array includes four memory banks 110a, 110b, 110c and 110d, like the general semiconductor memory device. In the memory banks 110a, 110b, 110c and 110d, an A bank 110a and a B bank 110b in a first memory region 112 may be determined to be accessed only by signals input through the first input/output port 120a, and a C bank 110c and a D bank 10d in a second memory region 114 may be determined to be accessed only by signals input through the second input/output port 120b.

In this case, read and write, refresh and precharge operations and the like for the first memory region 112 and the second memory region 114 are individually and independently performed through their respective input/output ports 120a and 120b. In other words, operation through any one input/output port is independent of and not dependent upon operation through another input/output port.

Such conventional multi-port semiconductor memory device, however, has the following problem in a refresh operation. In the multi-port semiconductor memory device, power is shared, thus, when a read/write operation is performed through one input/output port and a self-refresh operation is performed through another input/output port; an internal power source may become unstable. When a read or write operation is progressed through one input/output port, a refresh characteristic of another input/output port may become adversely affected.

SUMMARY OF THE INVENTION

Exemplary embodiments of the present invention provide a semiconductor memory device and a self-refresh method therefor, wherein periods through one input/output port may be different according to the kind of operation performed through another input/output port.

Exemplary embodiments of the present invention provide a semiconductor memory device and a self-refresh method therefor, which is capable of improving a refresh characteristic regardless of the kind of operations performed through the input/output port.

According to exemplary embodiments of the present invention, a semiconductor memory device includes a plurality of input/output ports having respective independent operations, wherein a self-refresh period through one of the plurality of input/output ports is subordinate to a sort of operation through another input/output port.

The semiconductor memory device may be a dual-port semiconductor memory device having two input/output ports. The self-refresh period through any one of the two input/output ports may be controlled to be subordinate to an operation of another input/output port in an active mode so as to become shorter than the period of operation in another mode. The active mode may be an operating mode for a read or write operation.

According to exemplary embodiments of the present invention, a semiconductor memory device includes first and second input/output ports to which command signals for an independent operation of a first mode or second mode are input, and a refresh period control circuit for controlling a self-refresh period when a self-refresh operation is performed through the second input/output port, wherein the self-refresh periods are controlled to be different according to the kind of operating modes of the first input/output port.

The self-refresh period may be controlled to be shorter in the second mode of the first input/output port than in the first mode thereof. The first mode may include a self-refresh mode and a precharge (stand-by) mode, and the second mode may include an active mode for a read or write operation.

The refresh control circuit may include an active mode sensing unit for sensing the start of an active mode of the first input/output port and generating a first pulse, and for sensing a completion of the active mode and generating a second pulse; a refresh period conversion signal generator for generating a refresh period conversion signal enabled by the first pulse and disabled by the second pulse output from the active mode sensing unit; and a refresh period controller for controlling a self-refresh period in a self-refresh performed through the second input/output port in response to the refresh period conversion signal.

The active mode sensing unit may be configured to sense an enable time of an RASB signal (row address strobe signal) of the first input/output port and generate the first pulse, and to sense a precharge start time after a completion of the active mode and generate the second pulse. The refresh period conversion signal generator may include a latch circuit that responds to the first pulse and the second pulse, and may be configured to generate a refresh period conversion signal that preserves an enable state only during an active mode period of the first input/output port. The refresh period controller may be configured to control a self-refresh period provided through the second input/output port, being shorter in an enable interval of the refresh period conversion signal than in a disable interval of the refresh period conversion signal. The control of the self-refresh period may be performed by controlling a delay time of an oscillator used to decide the self-refresh period.

According to exemplary embodiments of the present invention, a self-refresh method of a multi-port semiconductor memory device includes performing control, so that self-refresh periods through one input/output port become different according to a state of operating mode of another input/output port, in performing a self-refresh operation through at least one or more input/output ports.

The semiconductor memory device may be a dual-port semiconductor memory device having two input/output ports. A self-refresh period in the self-refresh operation through any one of the two input/output ports is subordinate to an operation of another input/output port in an active mode and, thus, may be controlled to be shorter than in the operation of another mode. The active mode may be an operating mode for a read or write operation.

The configuration described above according to exemplary embodiments of the present invention may improve the refresh characteristic in a multi-port semiconductor memory device, including a dual-port semiconductor memory device.

BRIEF DESCRIPTION OF THE DRAWINGS

Exemplary embodiments of the present invention will be understood in more detail from the following descriptions taken in conjunction with the attached drawings in which.

DETAILED DESCRIPTION OF EXEMPLARY EMBODIMENTS

Exemplary embodiments of the present invention now will be described more fully hereinafter with reference to the accompanying drawings. This invention may, however, be embodied in many different forms and should not be construed as limited to the exemplary embodiments set forth herein. Rather these exemplary embodiments are provided so that this disclosure will be thorough and complete, and will fully convey the scope of the invention to those skilled in the art.

Exemplary embodiments of the present invention are more fully described below with reference to FIGS. 3 to 7. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

Figure 3:
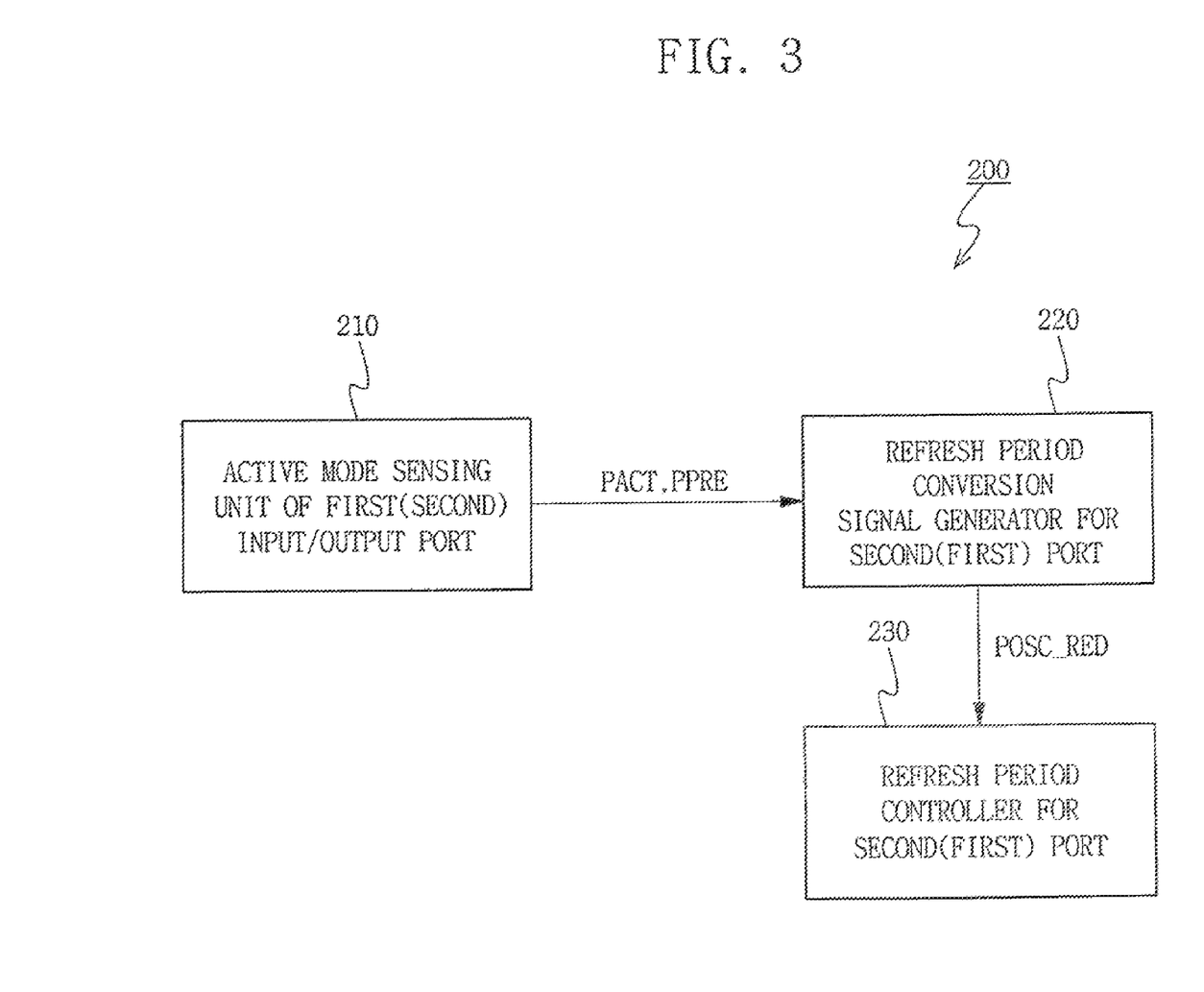
FIG. 3 is a block diagram of refresh control circuit constituting a semiconductor memory device according to an exemplary embodiment of the present invention.

A semiconductor memory device according to exemplary embodiments of the present invention may involve a multi-port semiconductor memory device, and the configuration accepting a refresh control circuit shown in FIG. 3 is the same. A dual-port semiconductor memory device having the refresh control circuit will be described, that is, modeling on a dual-port semiconductor memory device having first and second input/output ports, as an example of such a multi-port semiconductor memory device.

FIG. 3 is a block diagram of refresh control circuit constituting a dual-port semiconductor memory device according to exemplary embodiments of the present invention. The dual-port semiconductor memory device may include first and second input/output ports (not shown) through which command signals for independently performing operations of a first mode or a second mode are input. The second mode may include an active mode for an execution of read and writer operations, and the first mode may include a self-refresh mode and a precharge mode (standby mode) other than the active mode.

As shown in FIG. 3, a refresh control circuit 200 constituting a semiconductor memory device according to exemplary embodiments of the present invention controls a self-refresh period in a self-refresh operation through a second input/output port, or a first input/output port with different self-refresh periods based on the kind of operating modes of the first input/output port, or a second input/output port. In other words, a self-refresh operation through any one input/output port may be subordinate to a kind of operation through the other input/output port.

The refresh control circuit 200 may include an active mode sensing unit 210, a refresh period conversion signal generator 220, and a refresh period controller 230.

The active mode sensing unit 210 senses the start of the active mode of the first input/output port, or the second input/output port, and so generates a first pulse PACT as an active mode start signal. The active mode sensing unit 210 also senses a completion of the active mode or a precharge start and generates a second pulse PPRE accordingly.

The refresh period conversion signal generator 220 is enabled in response to the first pulse PACT output from the active mode sensing unit 210, and generates a refresh period conversion signal POSC_RED, which is disabled in response to the second pulse PPRE. The refresh period conversion signal POSC_RED provides a self-refresh period conversion interval in the self-refresh operation performed through the second input/output port, or the first input/output port.

The refresh period controller 230 controls a self-refresh period in a self-refresh operation performed through the second input/output port, or the first input/output port, in response to the refresh period conversion signal POSC_RED generated from the refresh period conversion signal generator 220. For example, the refresh period controller 230 does not vary a refresh period before the refresh period conversion signal POSC_RED is generated/enabled, so that the refresh operation is performed over an initial predetermined period. But, when the refresh period conversion signal POSC_RED is generated/enabled, the self-refresh period is varied in response to the refresh period conversion signal POSC_RED, and the self-refresh operation is performed by the varied refresh period, that is, with a refresh period shorter than a generated period.

The refresh period control may be performed through a method of controlling a delay time of an oscillator used to generate an internal refresh period, and may be also performed through other various methods by those skilled in the art.

Figure 4:
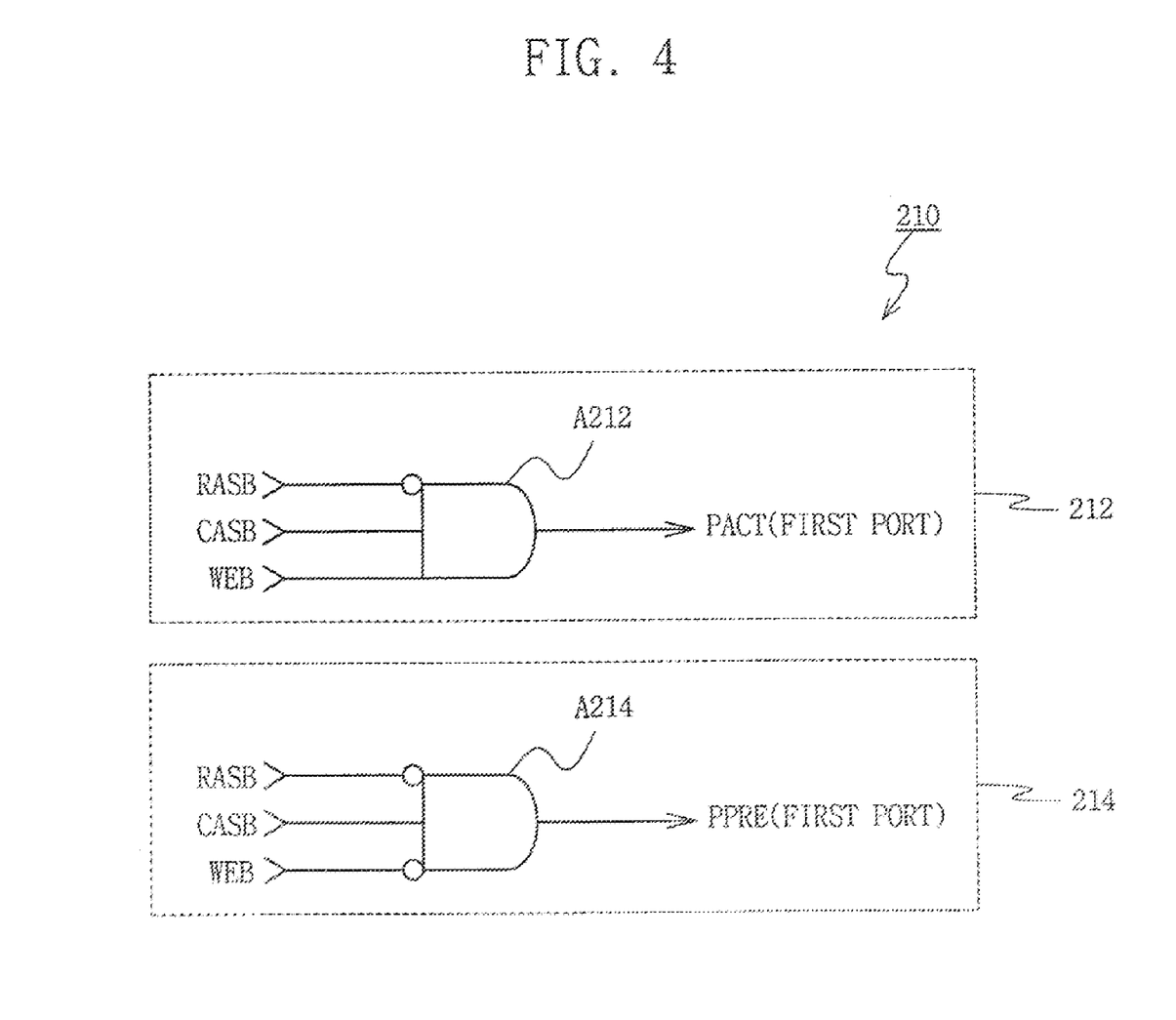
FIG. 4 is a circuit diagram of an active mode sensing unit used in the circuit shown in FIG. 3.

FIG. 4 illustrates an embodiment of the active mode sensing unit 210 shown in FIG. 3.

As shown in FIG. 4, the active mode sensing unit 210 includes a first pulse generator 212 for sensing the start of the active mode and generating the first pulse PACT, and a second pulse generator 214 for sensing the completion of the active mode, or a precharge start, and generating the second pulse PPRE. The active mode may be herein defined as being from a generation time point of the first pulse PACT to a generation time point of the second pulse PPRE.

The first pulse generator 212 generates the first pulse PACT by using a row address strobe signal RASB, a column address strobe signal CASB and a write enable signal WEB. The first pulse PACT may be generated as a single pulse of a high level when the row address strobe signal RASB has a low level, the column address strobe signal CASB has a high level and the write enable signal WEB has a high level. Thus, the first pulse PACT may be generated by sensing an input of the start command signals of the active mode. Herein, when signals giving a start of the active mode have other levels, or are configured with a combination of mutually different signals; these signals can be sensed as well, thereby also generating the first pulse PACT.

The first pulse generator 212 may be constructed of an AND circuit A212 having three input pins, or it may be constructed of two AND circuits each of which has two input pins. If there are more three signals defining a start of active mode, the first pulse generator 212 may be realized by a number of AND circuits having corresponding input pins or other logic circuits as the situation requires.

The second pulse generator 214 generates a second pulse PPRE by using a row address strobe signal RASB, a column address strobe signal CASB and a write enable signal WEB. The second pulse PPRE may be generated as a single pulse of a high level when the row address strobe signal RASB has a low level, the column address strobe signal CASB has a high level and the write enable signal WEB has a low level. The second pulse PPRE may be generated by sensing the input of a signal defining the completion of the active mode or command signals defining the start of the precharge mode. The completion of the active mode may indicate a start of the precharge mode. When the signals defining the completion of the active mode or the start of the precharge operation have different levels or are configured with a combination of different signals, these signals are sensed, generating the second pulse PPRE.

The second pulse generator 214 may be constructed of an AND circuit A214 having three input pins or it may be constructed of two AND circuits each of which each has two input pins. If there are more than three signals defining the completion of the active mode, the second pulse generator 214 may be realized by including additional AND circuits having corresponding input pins or other logic circuits as the situation requires.

Figure 5:
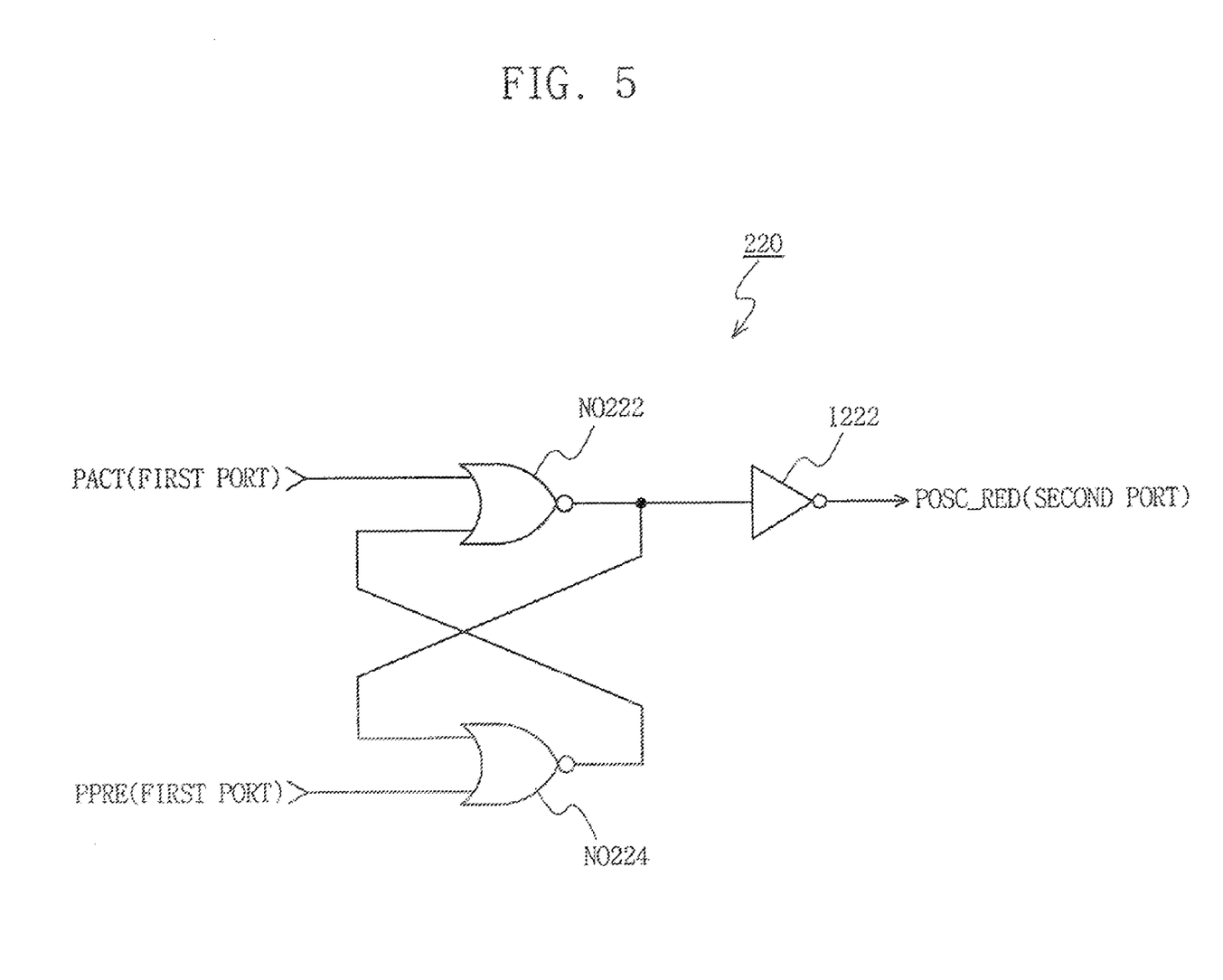
FIG. 5 is a circuit diagram of refresh period conversion signal generator used in the circuit shown in FIG. 3.

FIG. 5 is a circuit diagram of the refresh period conversion signal generator 220 shown in FIG. 3.

Referring to FIG. 5, the refresh period conversion signal generator 220 generates the refresh period conversion signal POSC_RED that is produced at a high level when the first pulse PACT is input thereto at a high level and then maintains the high level. The refresh period conversion signal POSC_RED is produced at a low level when the second pulse PPRE is input as a high level and then maintains the low level. The refresh period conversion signal POSC_RED maintains a high level only during an interval of the active mode, and maintains a low level in all other intervals. The refresh period conversion signal generator 220 may comprise a latch circuit constructed of NOR logic circuits NO222 and NO224, and an inverter circuit I222 to perform the above operations.

Figure 6:
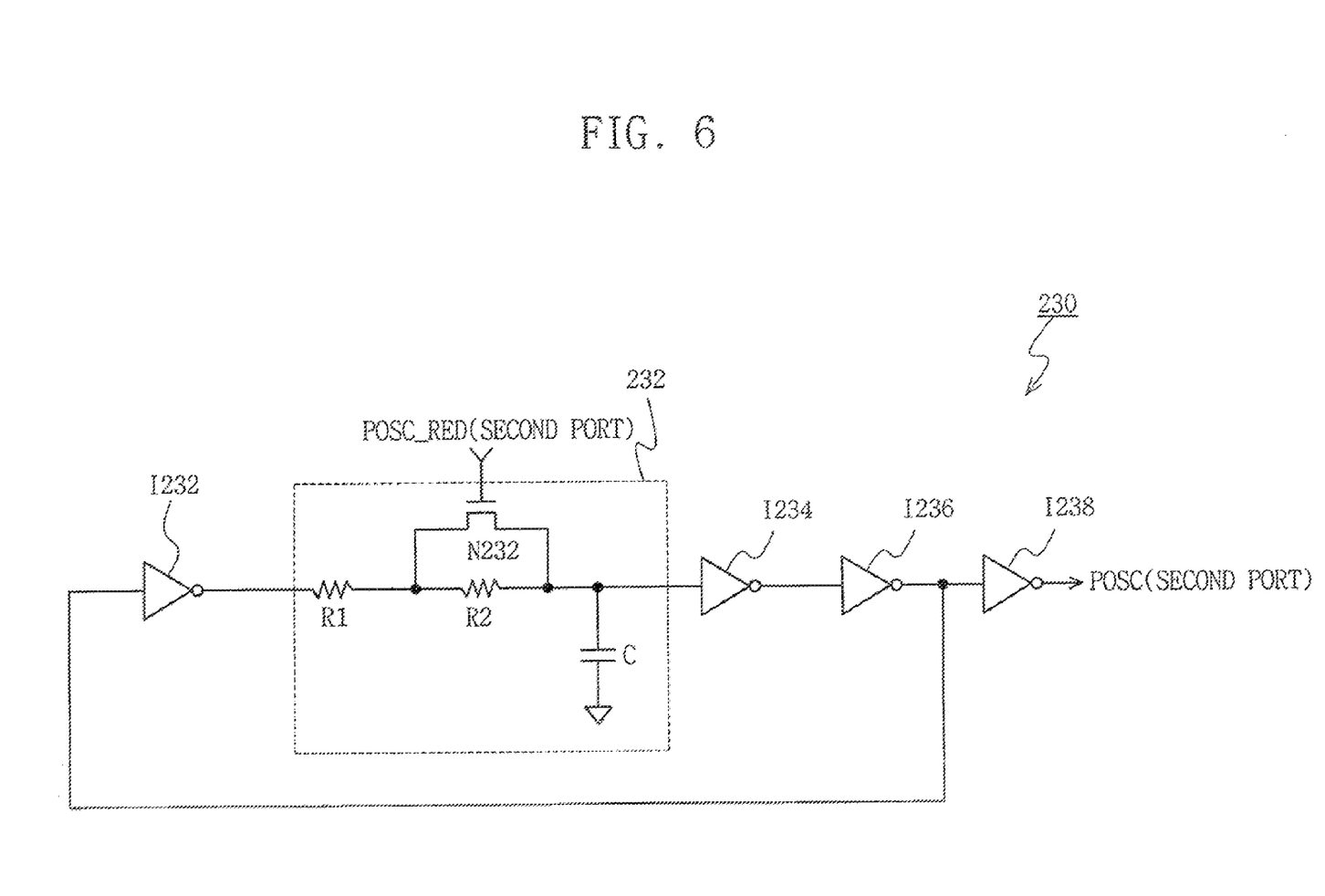
FIG. 6 is a circuit diagram of refresh period controller used in the circuit shown in FIG. 3.

FIG. 6 illustrates an example of the refresh period controller 230 shown in FIG. 3. In general, the refresh period controller 230 is configured to include various circuits for a refresh periodic control, and only a portion of the circuits for the period control will be herein described.

FIG. 6 illustrates the configuration of a ring oscillator used to generate a self-refresh period in a self-refresh mode.

As shown in FIG. 6, the refresh period controller 230 main include a ring oscillator circuit that has inverters I232, I234, I236 and I238, and an RC delay circuit 232 constructed of resistances R1 and R2 and a capacitor C. A transistor N232 for delay control of the RC delay circuit 232 may be also included in the RC delay circuit 232.

The refresh period controller 230 controls a delay of the RC delay circuit 232 by using the refresh period conversion signal POSC_RED to convert a refresh period of the second input/output port, or the first input/output port. That is, a self-refresh period signal POSC having a converted period by controlling a resistance value of the RC delay circuit 232 is generated.

The resistance value may be controlled by the transistor N232. The transistor N232 is turned on while the refresh period conversion signal POSC_RED maintains a high level, thereby lessening the total resistance value in the RC delay circuit 232. The transistor N232 is turned off while the refresh period conversion signal POSC_RED maintains a low level, thereby again changing the resistance value of the RC delay circuit 232. The period of the signal output from the ring oscillator circuit is varied by changing the resistance value. In other words, if the resistance value is large, the delay becomes long and so the period of the signal becomes long, and if the resistance value is small, the delay becomes short and the period of the signal becomes short.

According to the change of the resistance value in the RC delay circuit 232, the refresh period controller 230 generates the self-refresh period signal POSC having a period varied as described above. The self-refresh period signal POSC may be a signal used to decide a self-refresh period in a self-refresh operation.

Figure 7:
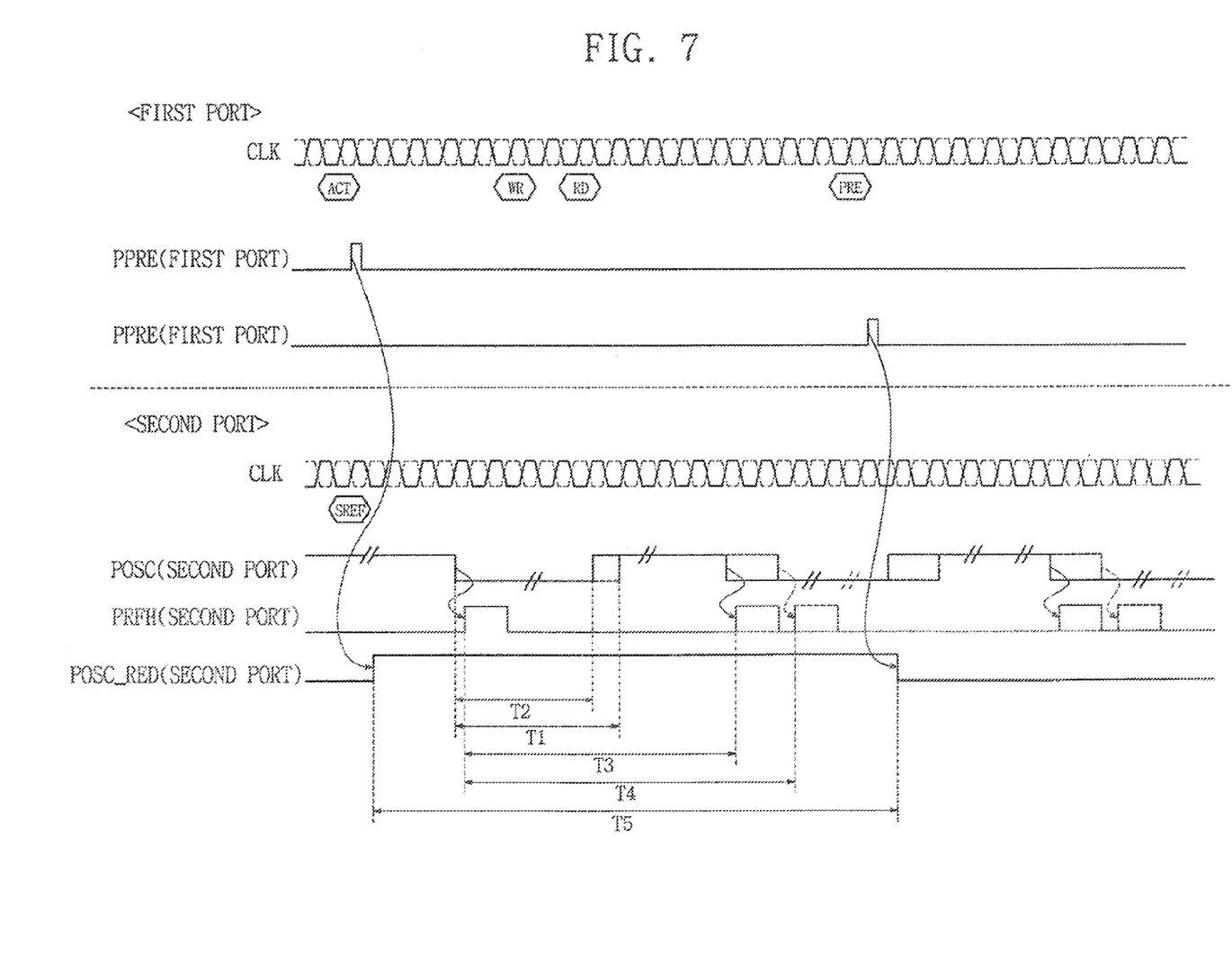
FIG. 7 illustrates operation timings of signals present in the circuits shown in FIGS. 4 to 6.

FIG. 7 illustrates operation timings of a dual-port semiconductor memory device according to exemplary embodiments of the present invention. In FIG. 7, "first port" indicates an active operating mode, and "second port" indicates a self-refresh mode.

As shown in FIG. 7, an active command ACT is applied through the first input/output port (first port), thus an active operating mode starts. The active start signal of the first input/output port is sensed, thereby generating the first pulse PACT from the active mode sensing unit 210.

On the other hand, a self-refresh command SREF is applied through the second input/output port for performing a self-refresh operation. As the self-refresh operation proceeds, the refresh period controller 230 generates the period control signal POSC having a given period. When the self-refresh period control signal POSC is generated, a self-refresh enable signal PRFH as a unit pulse is generated in response to the generation of the self-refresh period control signal POSC, every given period. For example, the self-refresh enable signal PRFH may be generated in response to a falling edge of the self-refresh period control signal POSC. The generation period of the self-refresh enable signal PRFH may be a self-refresh period.

At this time, when the first pulse PACT is generated, the self-refresh period conversion signal generator 220 responding to that pulse generation generates the self-refresh period conversion signal POSC_RED at a high level. When the self-refresh period conversion signal POSC_RED has the high level, a period of the self-refresh period control signal POSC becomes shortened by a given time. For example, if the self-refresh period conversion signal POSC_RED has a low level, a low level interval of the self-refresh period control signal POSC becomes "T1" and the period should then become a time "2T1". As the self-refresh period conversion signal POSC_RED has a high level, however, a low level interval of the self-refresh period control signal POSC becomes "T2" and a period becomes shortened as "2T2". Thus, a period of the self-refresh enable signal PRFH generated in response to a falling edge of the self-refresh period control signal POSC becomes short, specifically, from the existing "T4"(2T1) to "T3"(2T2). Accordingly, a refresh characteristic may be improved by performing a self-refresh operation in a short period.

Then, when the active mode is finished in the first input/output port and a precharge mode starts, that is, when a precharge start signal PRC is input through the first input/output port, the second pulse PPRE is generated from the active mode sensing unit 210.

When the second pulse PPRE is generated, the self-refresh period conversion signal generator 220 responding to that second pulse generation generates a self-refresh period conversion signal POSC_RED at a low level. When the self-refresh period conversion signal POSC_RED has the low level, the self-refresh period control signal POSC is restored to an original period. In other words, the self-refresh period conversion signal POSC_RED is restored to the original period of the low level state. As described above, in an interval T5 the self-refresh period conversion signal POSC_RED is enabled to a high level, the self-refresh period becomes shortened as compared with a normal case, and the rest interval has a normal self-refresh period.

In the multi-port semiconductor memory device having a dual-port semiconductor memory device described above, an active mode operation through any one input/output port is discriminated from an operation of other modes, thus refresh periods in the self-refresh operation through another input/output port may become different, thereby degradation of a refresh characteristic degradation may be prevented or substantially reduced according to an adjacent input/output port.

As described above, according to exemplary embodiments of the present invention, in a multi-port semiconductor memory device including a dual-port semiconductor memory device, depending on the kind of operation through any one input/output port, refresh periods through another input/output port may become different, thereby improving a refresh characteristic. In other words, the influence from an operation performed through another input/output port may be substantially reduced, thereby preventing or substantially reducing a refresh characteristic degradation.

It will be apparent to those skilled in the art that modifications and variations can be made in the exemplary embodiments of the present invention without deviating from the spirit or scope of the invention. Thus, it is intended that the present invention cover any such modifications and variations of this invention provided they come within the scope of the appended claims and their equivalents. For example, the internal configuration of circuits may be changed, or internal elements of circuits may be replaced with other equivalent elements. Accordingly, these and other changes and modifications are seen to be within the true spirit and scope of the invention as defined by the appended claims.

In the drawings and specification, there have been disclosed exemplary embodiments of the present invention and, although specific terms are employed, they are used in a generic and descriptive sense only and not for purposes of limitation, the scope of the invention being set forth in the following claims.

We claim:

1. A semiconductor memory device, comprising:
a plurality of input/output ports having respective independent operations of a first mode and a second mode, wherein a period of a self-refresh mode through one of the plurality of input/output ports in the second mode is changed in response to the first mode of operation through another input/output port; and
a refresh period control circuit,
wherein the self-refresh period is controlled to be shorter in the second mode than in the first mode, and
wherein the refresh period control circuit comprises:
an active mode sensing unit for sensing a start of the active mode of the first input/output port and generating a first pulse, and sensing a completion of the active mode and generating a second pulse;
a refresh period conversion signal generator for generating a refresh period conversion signal enabled by the first pulse and disabled by the second pulse output from the active mode sensing unit; and
a refresh period controller for controlling the self-refresh period in a self-refresh performed through the second input/output port in response to the refresh period conversion signal.

2. The device of claim 1, wherein the semiconductor memory device is a dual-port semiconductor memory device having two input/output ports.

3. The device of claim 1, wherein the active mode is an operating mode for a read or write operation.

4. A semiconductor memory device, comprising:
first and second input/output ports each having an input for command signals to independently perform operations of a first mode or second mode; and
a refresh period control circuit for controlling a self-refresh period when a self-refresh operation is performed through the second input/output port, wherein the self-refresh periods are controlled to be different according to a kind of operating modes of the first input/output port,
wherein the self-refresh period is controlled to be shorter in the second mode of the first input/output port than in the first mode,
wherein the first mode includes a self refresh mode and a precharge(stand-by) mode, and the second mode includes an active mode for a read or write operation, and
wherein the refresh period control circuit comprises:
an active mode sensing unit for sensing a start of the active mode of the first input/output port and generating a first pulse, and sensing a completion of the active mode and generating a second pulse;
a refresh period conversion signal generator for generating a refresh period conversion signal enabled by the first pulse and disabled by the second pulse output from the active mode sensing unit; and
a refresh period controller for controlling the self-refresh period in a self-refresh performed through the second input/output port in response to the refresh period conversion signal.

5. The device of claim 4, wherein the active mode sensing unit senses an enable time of a row address strobe signal of the first input/output port and generates the first pulse, and senses a precharge start time after a completion of the active mode and generates the second pulse.

6. The device of claim 5, wherein the refresh period conversion signal generator comprises a latch circuit responding to the first pulse and the second pulse, and generates a refresh period conversion signal to preserve an enable state only during an active mode period of the first input/output port.

7. The device of claim 6, wherein the refresh period controller controls the self-refresh period through the second input/output port to be shorter in an enable interval of the refresh period conversion signal than in a disable interval of the refresh period conversion signal.

8. The device of claim 7, wherein The control of the self-refresh period is performed by controlling a delay time of an oscillator to decide a self-refresh period.

9. A self-refresh method of a multi-port semiconductor memory device having a first mode and a second mode of independent operations, comprising:
controlling self-refresh periods through a first input/output port to become different according to a state of an operating mode of a second input/output port, in a self-refresh operation,
wherein the self-refresh period is controlled to be shorter in the second mode of the first input/output port than in the first mode
wherein the first mode includes a self-refresh mode and a precharge (standby) mode, and the second mode includes an active mode for a read or write operation, and
wherein controlling the self-refresh period comprises:
sensing a start of the active mode of the first input/output port and generating a first pulse, and sensing a completion of the active mode and generating a second pulse;
generating a refresh period conversion signal enabled by the first pulse and disabled by the second pulse output from an active mode sensing unit; and
controlling the self-refresh period in a self-refresh operation performed through the second input/output port in response to the refresh period conversion signal.

10. The method of claim 9, wherein the semiconductor memory device is a dual-port semiconductor memory device having two input/output ports.

* * * * *